(12) United States Patent
Kim

(10) Patent No.: US 7,663,940 B2
(45) Date of Patent: Feb. 16, 2010

(54) SEMICONDUCTOR MEMORY DEVICE AND DRIVING METHOD THEREOF

(75) Inventor: Jee-Yul Kim, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 172 days.

(21) Appl. No.: 12/005,901

(22) Filed: Dec. 28, 2007

(65) Prior Publication Data

US 2008/0165594 A1 Jul. 10, 2008

(30) Foreign Application Priority Data

Jan. 8, 2007 (KR) ...................... 10-2007-0002067

(51) Int. Cl.
*G11C 7/00* (2006.01)

(52) U.S. Cl. .................. 365/189.11; 365/203

(58) Field of Classification Search ............ 365/189.11, 365/189.04, 203
See application file for complete search history.

(56) References Cited

U.S. PATENT DOCUMENTS

| | | | | |
|---|---|---|---|---|
| 6,320,806 | B1 * | 11/2001 | Han ............................. | 365/203 |
| 6,504,774 | B2 * | 1/2003 | Yoon et al. ................... | 365/203 |
| 6,853,593 | B1 * | 2/2005 | Bae ........................ | 365/189.09 |
| 6,930,939 | B2 * | 8/2005 | Lim et al. .................... | 365/203 |
| 7,019,555 | B2 | 3/2006 | Lee | |
| 7,034,567 | B2 | 4/2006 | Jang | |
| 7,054,202 | B2 | 5/2006 | Lee et al. | |
| 7,151,703 | B2 | 12/2006 | Lee et al. | |
| 2005/0180229 | A1 | 8/2005 | Jin | |
| 2005/0268059 | A1 | 12/2005 | LaBerge | |

FOREIGN PATENT DOCUMENTS

| | | |
|---|---|---|
| JP | 09-147560 | 6/1997 |
| JP | 2004-310981 | 11/2004 |
| JP | 2004-362756 | 12/2004 |
| JP | 2005-228458 | 8/2005 |
| KR | 10-2005-0106833 | 11/2005 |

* cited by examiner

*Primary Examiner*—Anh Phung
(74) *Attorney, Agent, or Firm*—Blakely, Sokoloff, Taylor & Zafman

(57) ABSTRACT

A semiconductor memory device is capable of reducing the current dissipation in a termination circuit and allowing a voltage level of a GIO line to rapidly reach a voltage level of a termination voltage when a termination operation is performed. The semiconductor memory device includes a global input/output line configured to transport data between a core region and an interface region, a main driving block configure to drive a voltage level of the global input/output line to predetermined termination voltage level in response to a termination enabling signal, and an auxiliary driving block configured to drive the is voltage level of the global input/output line to the predetermined termination voltage level in response to an over-driving signal, wherein the over-driving signal is enabled for a predetermined period of time during an initial period of an enabling interval for the termination enabling signal.

15 Claims, 7 Drawing Sheets

US 7,663,940 B2

SEMICONDUCTOR MEMORY DEVICE AND DRIVING METHOD THEREOF

CROSS-REFERENCE TO RELATED APPLICATIONS

The present invention claims priority to Korean patent application number 10-2007-0002067, filed on Jan. 8, 2007, which is incorporated by reference in its entirety.

BACKGROUND OF THE INVENTION

The present invention relates to a semiconductor memory device and a driving method thereof, more particularly to a semiconductor memory device based on a termination operation applied to data lines and a driving method thereof.

As the amount of data for a semiconductor memory device to process increases, a chip size of the semiconductor memory device also increases. This increase in the chip size allows the elongation of data lines. For instance, for a 512 MB-level semiconductor memory device, there usually exist 4 banks, and for a 1 GB-level semiconductor memory device, the number of banks increases to 8 banks. Hence, the loading of data lines for transporting data to be accessed at a specific bank increases as much as the increased number of the bank, for instance, nearly by 2-fold.

Data lines used in semiconductor memory device are classified into segmental input/output lines, local input/output (LIO) lines, and global input/output (GIO) lines depending on the position of the data lines. In particular, since the GIO lines have a relatively heavier loading than other input/output lines, data are more likely to be distorted or damaged. Thus, a repeater operation in which two inverters are placed in an approximate mid point of the GIO lines is implemented to overcome the data distortion or damage. However, the repeater operation is merely one approach of using a driver even if the driver has an improved structure. For the repeater mode, a high amount of current is generally required due to a large number of transistors used and enlarged drivers. Accordingly, applying a termination operation to the GIO lines is another suggested approach to overcome this limitation.

According to the termination operation, prior to loading data onto the GIO lines, a voltage level of the GIO lines is pre-charged to a voltage level of a termination voltage V_TERM, for instance, ½ of a voltage level of a power supply voltage VDD. In an interval in which data are supplied, a termination operation is performed, so that a voltage level change (i.e., a width of a swing) caused by the data loaded onto the GIO lines can be reduced. As a result, the reduced swing width of a voltage in the GIO lines allows a less amount of current to be consumed, and a time parameter, usually represented with denotation 'tAA,' in a semiconductor memory device can be less variable.

FIG. 1 is a block diagram of a conventional semiconductor memory device. During a read operation, although not illustrated, data stored on a cell are transmitted t a read sense amplifier (SA) 20 through a LIO line LIO. The data amplified in the read SA 20 are transported to a data output mux 30 through a GIO line GIO. The data muxed in the data output mux 30 are output to a pad 50 through a pipe latch 40. During a write operation, a write SA 60 amplifies data input through the pad 50 and transports to a write driver 70 through the GIO line GIO. The write driver 70 drives the data, which are subsequently stored in the cell through the LIO line LIO.

A voltage level of the GIO line GIO fully swings from a voltage level of a power supply voltage VDD to a voltage level of a ground voltage VSS according to data. However, a termination circuit 10 performs a termination operation prior to loading data onto the GIO line GIO, so as to pre-charge a voltage level of the GIO line GIO to a voltage level that is one half of the voltage level of the power supply voltage VDD. Although the data are supplied, because of the continuously performed termination operation, the voltage level of the GIO line GIO does not fully swing but swings within a range of VDD/2 +ΔV (i.e., logic threshold voltage) and VDD/2 −ΔV.

FIG. 2 is a signal timing diagram for illustrating a width change in a voltage level of the GIO line GIO when the termination circuit 10 operates. When the termination circuit 10 does not operate, for a signal OFF_TERM that instructs the termination of the termination operation, the voltage level of the GIO line GIO fully swings from a voltage level of a power supply voltage VDD to a voltage level of a ground voltage VSS. On the other hand, when the termination circuit 10 operates, for a signal ON_TERM that instructs the performance of the termination operation, the voltage level of the GIO line GIO swings within a range between VDD/2 +ΔV and VDD/2 −ΔV.

FIG. 3 is a circuit diagram of the termination circuit 10 illustrated in FIG. 1. The termination circuit 10 includes an N-type channel metal oxide semiconductor (NMOS) transistor NM1, a P-type channel metal oxide semiconductor (PMOS) PM1, a PMOS diode PMD1, an NMOS diode NMD1, and resistors R1 and R2. The NMOS transistor NM1 turns on in response to a termination enabling signal EN_TERM, and the PMOS transistor PM1 turns on in response to an inverted signal of the termination enabling signal EN_TERM. The PMOS diode PMD1 and the NMOS diode NMD1, and the resistors R1 and R2 are coupled respectively together between the NMOS transistor NM1 and the PMOS transistor PM1. The termination circuit 10 may further include a latch block 11 latching data loaded onto a GIO line GIO.

The termination circuit 10 usually executes a termination operation when the termination enabling signal EN_TERM is in a logically high state, and stops the termination operation when the termination enabling signal EN_TERM is in a logically low state. Thus, during the execution of the termination operation, a voltage level of the GIO line GIO is precharged to a voltage level of a termination voltage V_TERM. When data are loaded onto the GIO line GIO, the voltage level of the termination voltage V_TERM conflicts with that of the data, and thus, the full swing of the voltage level of the GIO line GIO can be prevented.

The latch block 11 is activated when the termination enabling signal EN_TERM is in a logically low state, and latches a logic high or low value to a target according to the data loaded onto the GIO line GIO, so as to prevent a floating event in the GIO line GIO.

FIG. 4 is a signal timing diagram of a termination operation by the termination circuit 10 illustrated in FIG. 3. An internal read pulse (IRDP) is a signal generated in response to a read command, and an input/output strobe pulse (IOSTBP) is a signal used to enable the read SA 20 (see FIG. 1). A signal labeled as 'YBSTC' is a signal that becomes a logic high in response to the internal read pulse IDP, and transits from the logic high to a logic low according to the length of a burst. A termination enabling signal EN_TERM is a signal that is set to a logic high when the 'YBSTC' signal becomes a logic high, and reset to a logic low after a certain delay time when the 'YBSTC' signal transits to a logic low.

For instance, when data having a logic low are read under the state in which the GIO line GIO is latched with a logic high, the termination enabling signal EN_TERM is enabled, so that a voltage level of the GIO line GIO gradually decreases to a voltage level of the termination voltage V_TERM. When the input/output strobe pulse IOSTBP is enabled at the voltage level of the termination voltage V_TERM, the read SA 20 (se FIG. 1) operates to decrease the voltage level of the GIO line GIO. The data output mux 30 (see FIG. 1) senses the lowered voltage level of the GIO line GIO, and the GIO line GIO sustains again the voltage level of the termination voltage V_TERM.

According to the conventional circuit configuration described above, the termination circuit 10 often dissipates current due to the generation of a direct current path in an interval in which the termination enabling signal EN_TERM is enabled. In an attempt to reduce the current dissipation, a resistor that has high resistance is added to the termination circuit 10. However, it may take a long time for the GIO line GIO to reach the voltage level of the termination voltage V_TERM when the termination operation is performed.

FIG. 5 is a signal timing diagram to show potential limitations associated with the conventional termination circuit 10 illustrated in FIG. 3. Since the signals illustrated in FIG. 5 are substantially the same as those described FIG. 4, detailed description thereof will be omitted.

A resistor that has high resistance is additionally provided to the termination circuit 10 to minimize the current dissipation. Alternatively, the voltage level of the GIO line GIO may not be sufficiently reduced to the voltage level of the termination voltage V_TERM according to parameters such as process, voltage and temperature (PVT). In such a case, even though the read SA 20 operates in response to the input/output strobe pulse IOSTBP, the voltage level of the GIO line GIO may not be sufficient for the accurate detection by the data output mux 30. In particular, this insufficient voltage level of the GIO line GIO often occurs when the data latched on the GIO line GIO is different from the data that the read SA 20 is to drive. In a severe case, the data output mux 30 senses data opposite to the data that the read SA 20 is to drive. This opposite sensing of the data output mux 30 may reduce the reliability of data and circuit operations.

SUMMARY OF THE INVENTION

Specific embodiments of the present invention are directed toward providing a semiconductor memory device capable of reducing the current dissipation in a termination circuit and allowing a voltage level of a GIO line to rapidly reach a voltage level of a termination voltage when a termination operation is performed, and a driving method of the semiconductor memory device.

In accordance with one aspect of the present invention, there is provided a semiconductor memory device. The semiconductor memory device includes a global input/output line configured to transport data between a core region and an interface region, a main driving block configure to drive a voltage level of the global input/output line to predetermined termination voltage level in response to a termination enabling signal, and an auxiliary driving block configured to drive the voltage level of the global input/output line to the predetermined termination voltage level in response to an over-driving signal, wherein the over-driving signal is enabled for a predetermined period of time during an initial period of an enabling interval for the termination enabling signal.

In accordance with another embodiment of the present invention, there is provided a method for driving a semiconductor memory device including a global input/output line used to transport data between a core region and an interface region. The method includes driving a voltage level of the global input/output line to a predetermined termination voltage level for a predetermined period of time during an initial period of an enabling interval for a termination enabling signal, and driving the voltage level of the global input/output line with driving power lower than driving power used for the predetermined period of time during the enabling interval of the termination enabling signal.

DESCRIPTION OF SPECIFIC EMBODIMENTS

Hereinafter, the present invention and exemplary embodiments thereof are more fully described below with reference to the accompanying drawings for being easily implemented by those of ordinary skill in the art.

Figure 1:
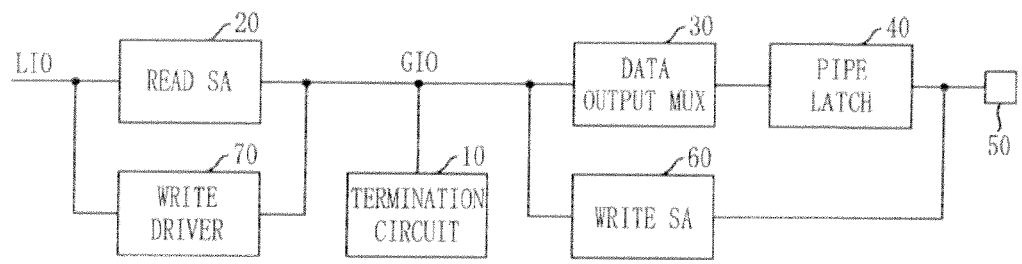
FIG. 1 is a block diagram of a conventional semiconductor memory device.
Figure 2:
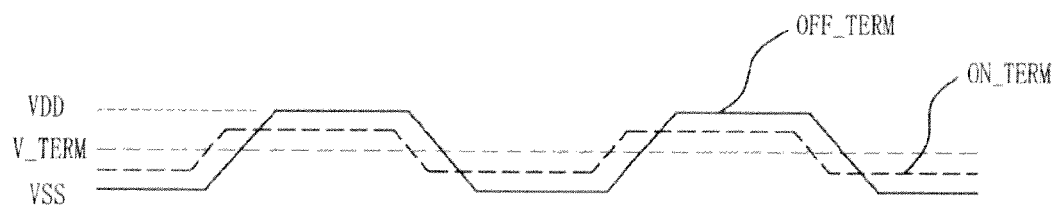
FIG. 2 is a signal timing diagram for illustrating a change in the width of a voltage level of a global input/output (GIO) line when a conventional termination circuit of FIG. 1 operates.
Figure 3:
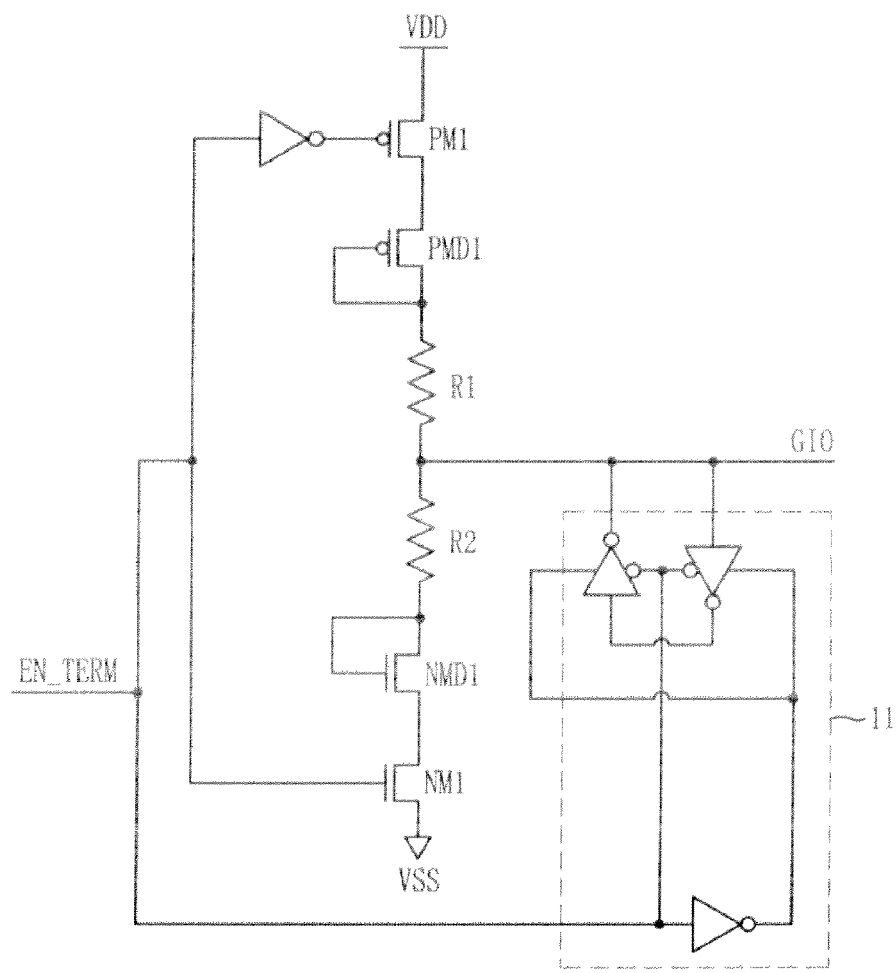
FIG. 3 is a circuit diagram of the conventional termination circuit illustrated in FIG. 1.
Figure 4:
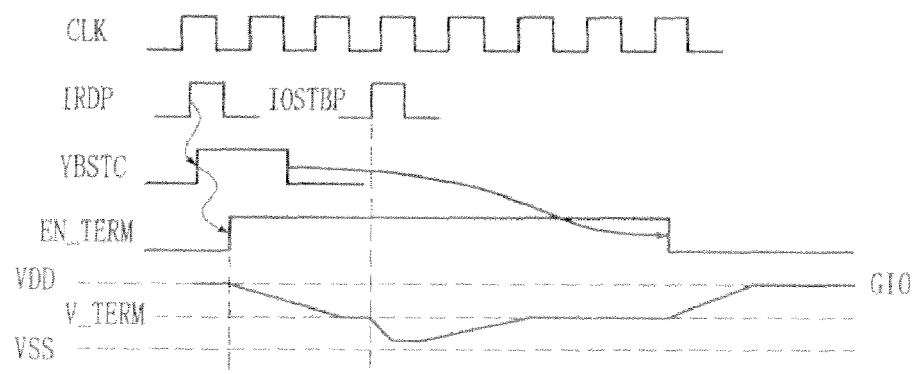
FIG. 4 is a signal timing diagram of a termination operation by the termination circuit illustrated in FIG. 3.
Figure 5:
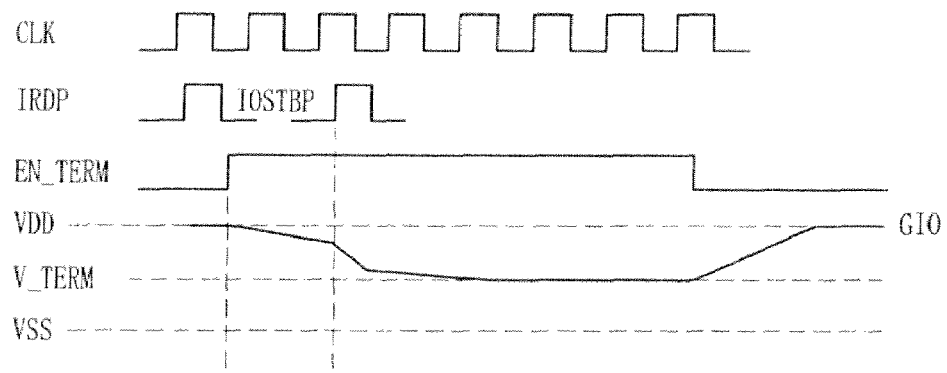
FIG. 5 is a signal timing diagram for describing potential limitations associated with the conventional termination circuit.
Figure 6:
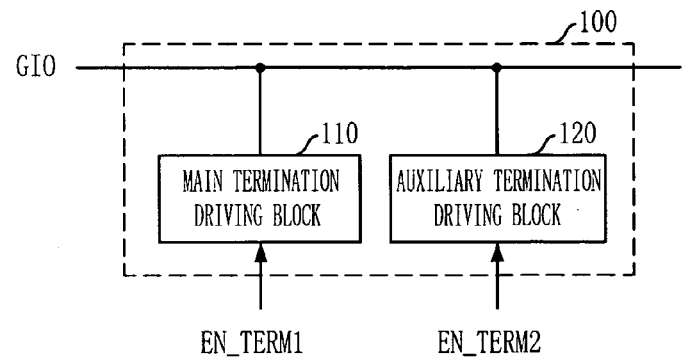
FIG. 6 is a block diagram of a termination circuit in accordance with an embodiment of the present invention.

FIG. 6 is a simplified block diagram of a termination circuit 100 in accordance with an embodiment of the present invention. The termination circuit 100 includes a global input/output (GIO) line GIO, a main termination driving block 110, and an auxiliary termination diving block 120. The GIO line GIO is used to transport data, which are input and output between a core region and an interface region, to a target. The core region indicates a region where the read SA 20 and the write driver 70 exist as illustrated in FIG. 1, while the interface region indicates a region where the data output mux 30 and the write SA 60 exist as illustrated in FIG. 1.

In response to a first termination enabling signal EN_TERM1, the main termination driving block 110 performs a termination operation of the GIO line GIO. The auxiliary termination driving block 120 performs a termination operation of the GIO line GIO in response to a second termination enabling signal EN_TERM2. The first termination enabling signal EN_TERM1 is enabled in an interval in which the termination operation of the GIO line GIO is performed. The second termination enabling signal EN_TERM2 is enabled for a certain period of time during an initial period of an interval in which the first termination enabling signal EN_TERM is enabled.

Figure 7:
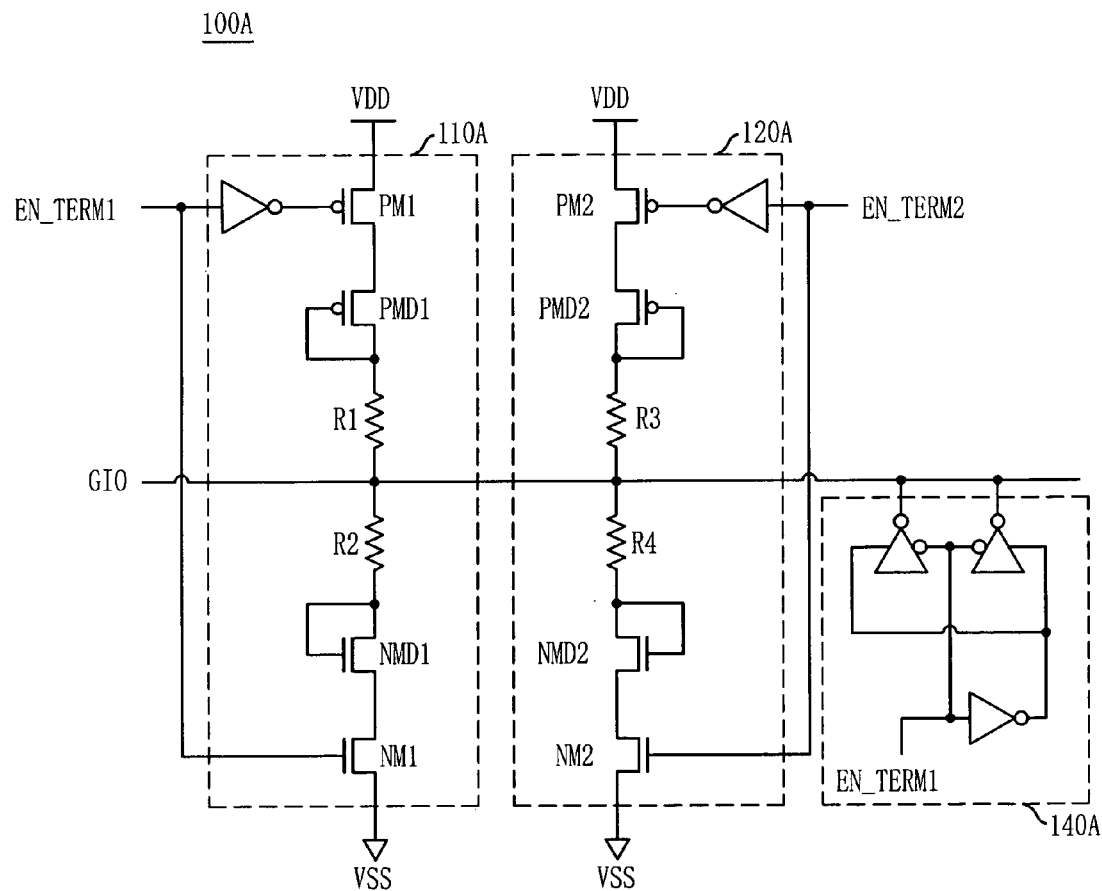
FIG. 7 is a schematic circuit diagram of the termination circuit illustrated in FIG. 6 in accordance with an embodiment of the present invention.

FIG. 7 is a schematic circuit diagram of the termination circuit 100 illustrated in FIG. 6 in accordance with an embodiment of the present invention. Hereinafter, the termination circuit having the illustrated circuit configuration in FIG. 7 is denoted with reference numeral 100A.

According to the first embodiment, a main termination driving block 110A of the termination circuit 100A includes a first P-type channel metal oxide semiconductor (PMOS) transistor PM1, a first N-type channel metal oxide semiconductor (NMOS) transistor NM1, a first PMOS diode PMD1, first and second resistors R1 and R2, and a first NMOS diode NMD1. The first PMOS transistor PM1 responds to an inverted signal of the first termination enabling signal EN_TERM1. The first NMOS transistor NM1 responds to the first termination enabling signal EN_TERM1. The first PMOS diode PMD1, the first and second resistors R1 and R2, and the first NMOS diode NMD1 are coupled respectively together between the first PMOS transistor PM1 and the first NMOS transistor NM1. The first PMOS diode PMD1 and the first NMOS diode NMD1, and the first and second resistors R1 and R2 are provided to reduce current dissipation, which often occurs during the termination operation. Particularly, the first and second resistors R1 and R2 may have high resistance, and the first PMOS diode PMD1 and the first NMOS diode NMD1 may be small.

The auxiliary termination driving block 120A includes a second PMOS transistor PM2, a second NMOS transistor NMD2, a second PMOS diode PMD2, third and fourth resistors R3 and R4, and a second NMOS diode NMD2. The second PMOS transistor PM2 responds to an inverted signal of the second termination enabling signal EN_TERM2. The second NMOS transistor NM2 responds to the second termination enabling signal EN_TERM2. The second PMOS diode PMD2, the third and fourth resistors R3 and R4, and the second NMOS diode NMD2 are coupled respectively together between the second PMOS transistor PM2 and the second NMOS transistor NM2. The second PMOS diode PMD2 and the second NMOS diode NMD2, and the third and fourth resistors R3 and R4 are used to supply high driving power during the termination operation. Particularly, the third and fourth resistors R3 and R4 have low resistance, and the second PMOS diode PMD2 and the second NMOS diode NMD2 may be large.

According to the first embodiment, the termination circuit 100A may further include a signal generator used to generate the first and second enabling signals EN_TERM1 and EN_TERM2 (not illustrated), and a latch block 140A used to latch data loaded on a GIO line GIO. The signal generator and the latch block 140A will be described in detail later.

Figure 8:
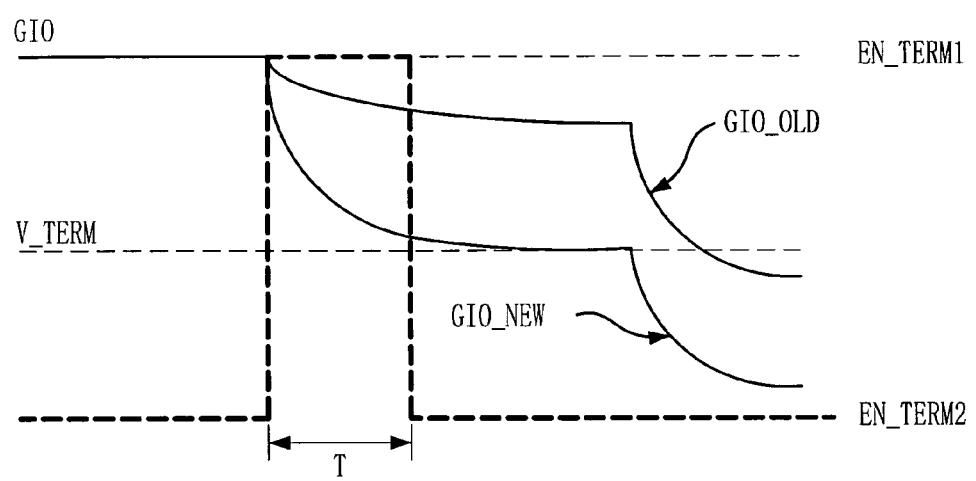
FIG. 8 is a signal timing diagram for illustrating a voltage level of a GIO line according to first and second termination enabling signals illustrated in FIG. 6 in comparison with that of the conventional GIO line.

FIG. 8 is a signal timing diagram for illustrating a voltage level of a GIO line according to the first and second termination enabling signals EN_TERM1 and EN_TERM2 illustrated in FIG. 6 in comparison with the voltage level of the conventional GIO line.

During a predetermined period of time T for which the first and second termination enabling signals EN_TERM1 and EN_TERM2 are enabled, high driving power allows sufficient driving of a voltage level of the GIO line (GIO-NEW), which is contrived according to an embodiment of the present invention, to a voltage level of a termination voltage V_TERM. For the conventional GIO line (GIO_OLD), even if data of logic low are input to a target, accuracy of detecting the input data is often reduced because a voltage level of the GIO line decreases from a voltage level higher than the termination voltage V_TERM. On the other hand, for the GIO line (GIO_NEW), a sufficient voltage level of the termination voltage V_TERM can be obtained, thereby allowing the accurate detection of the input data.

Figure 9:
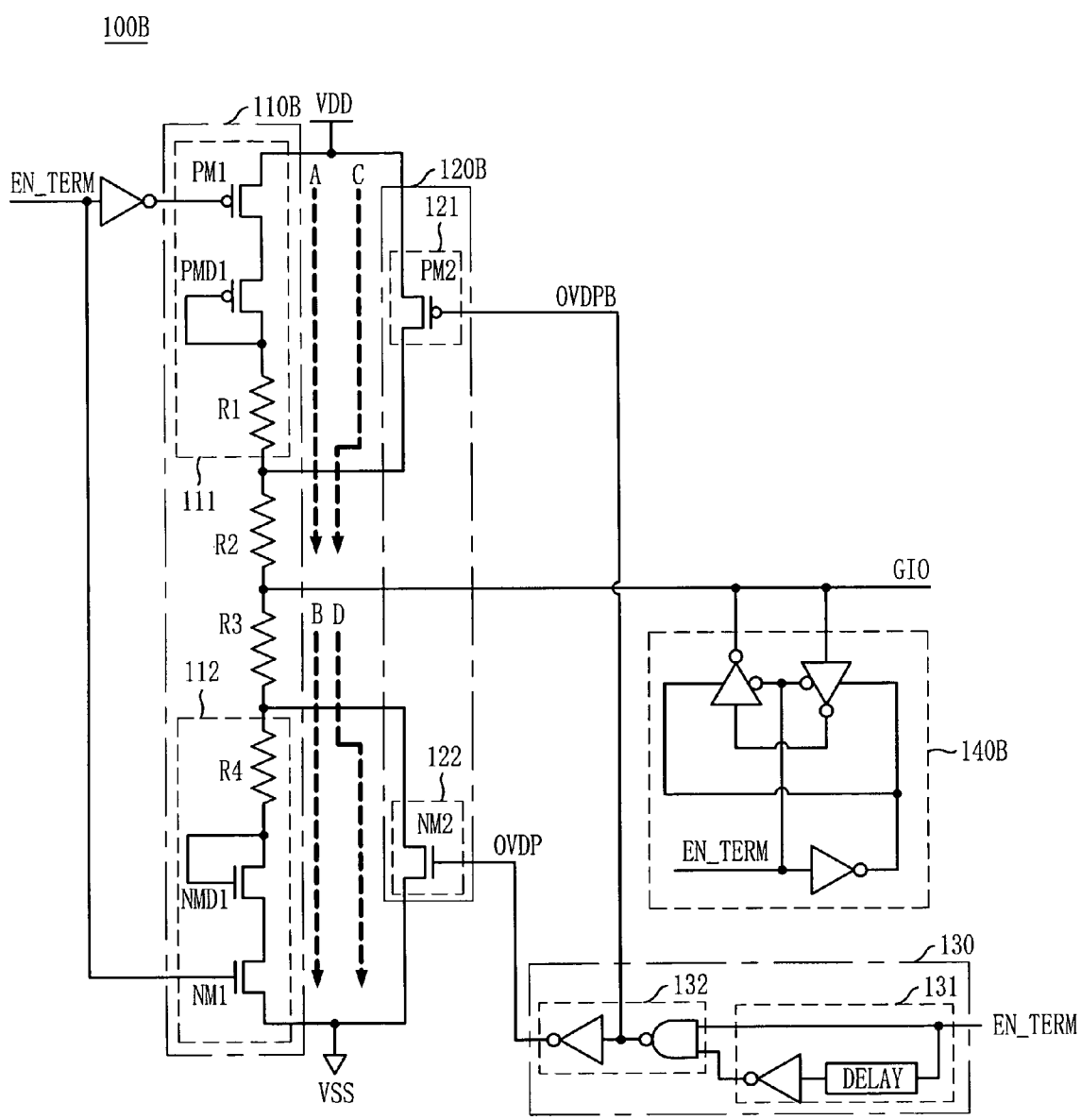
FIG. 9 is a schematic circuit diagram of the termination circuit illustrated in FIG. 6 in accordance with another embodiment of the present invention.

FIG. 9 is a schematic circuit diagram of the termination circuit 100 illustrated in FIG. 6 in accordance with another embodiment of the present invention. Hereinafter, the termination circuit having the illustrated circuit configuration in FIG. 9 is denoted with reference numeral 100B.

The termination circuit 100B includes a main termination driving block 110B and an auxiliary termination driving block 120B. The main termination driving block 110B is used to allow a voltage level of a GIO line GIO to become a voltage level of a termination voltage V_TERM during the termination operation. The auxiliary termination driving block 120B is used to additionally perform a termination operation of the GIO line GIO for a certain period of time during and initial period of an interval in which a termination enabling signal EN_TERM is enabled.

The main termination driving block 110B includes a first main termination driving unit 111 and a second main termination driving unit 112. The first main termination driving unit 111 generates a current path 'A' between a terminal of an external power supply voltage VDD and a GIO line GIO in response to an inverted signal of the termination enabling signal EN_TERM. The second main termination driving unit 112 generates a current path 'B' between the GIO line GIO and a terminal of a ground voltage VSS in response to the termination enabling signal EN_TERM. The current path 'A' runs from the terminal of the external power supply voltage VDD to the GIO line GIO through a first PMOS transistor PM1, a PMOS diode PMD1, a first resistor R1, and a second resistor R2 in sequence. The current path 'B' runs from the GIO line GIO to the terminal of the ground voltage VSS through a third resistor R3, a fourth resistor R4, and NMO diode NMD1, and a first NMOS transistor NM1 in sequence.

The auxiliary termination driving block 120B includes a first auxiliary termination driving unit 121 and a second auxiliary termination driving unit 122. The auxiliary termination driving block 120B is controlled by a first over-driving signal OVDPB and a second over-driving signal OVDP. The first over-driving signal OVDPB and the second over-driving signal OVDP are enabled respectively in a logically low state and a logically high state for a certain period of time during an initial period of an interval in which the termination enabling EN_TERM is enabled. Also, the first auxiliary termination driving unit 121 generates a current path 'C' between the terminal of the external power supply terminal VDD and the GIO line GIO in response to the first over-driving signal OVDPB. The second auxiliary termination driving unit 122 generates a current path 'D' between the GIO line GIO and the terminal of the ground voltage VSS in response to the second over-driving signal OVDP. The current path 'C' runs from the terminal of the external power supply voltage VDD to the GIO line GIO through a second PMOS transistor PM2 and the second resistor R2 in sequence. The current path 'D' runs from the GIO line GIO to the terminal of the ground voltage VSS through a second NMOS transistor NM2.

For the certain period of time during the initial period of the enabling interval for the termination enabling signal EN_TERM, the main termination driving block 110B and the auxiliary termination driving block 120B operate together to drive a voltage level of the GIO line GIO to a voltage level of the termination voltage V_TERM. Afterwards, the auxiliary termination driving block 120B is disabled to drive the GIO line GIO in connection with the operation of the main termination driving block 110B. In detail, for the certain period of time during the initial period of the enabling interval for the termination enabling signal EN_TERM, the current paths 'A', 'B', 'C', and 'D' are used to drive the GIO line GIO with high driving power. Afterwards, only the current paths 'A' and 'B' are used to reduce current dissipation.

According to the second embodiment of the present invention, the termination circuit 100B may further include a signal generator 130 and a latch block 140B. The signal generator 130 generates the first and second over-driving signals OVDPB and OVDP, and the latch block-140 is used to latch data loaded onto the GIO line GIO.

The signal generator 130 includes a delay unit 131 and an output unit 132. The delay unit 131 delays the termination for a certain period of time upon receiving the termination enabling signal EN_TERM. The output unit 132 receives the termination enabling signal EN-TERM and an output signal of the delay unit 131, and outputs the first and second over-driving signals OVDPB and OVDP The delay unit 131 includes odd number of inverters to generate an inverted and delayed signal of the termination enabling signal EN_TERM. The first termination enabling signal EN-TERM1 according to the second embodiment, and the second termination enabling signal EN_TERM2 according to the first embodiment is substantially the dame as the second over-driving signal OVDP according to the second embodiment.

The latch block 140B operates as a three-state latch in those intervals except for the termination enabling interval. When the termination enabling signal EN-TERM according to the second embodiment (or the first termination enabling signal EN-TERM1 according to the first embodiment) has a logic low, the latch block 140B (or the latch block 140A for the first embodiment) operates, and stops the operation when the termination enabling signal EN_TERM has a logic high. As a result, the latch block 140B latches the logic value of 'high' or 'low' according to the data loaded onto the GIO line GIO, so as to prevent a floating event in the GIO line GIO.

Figure 10:
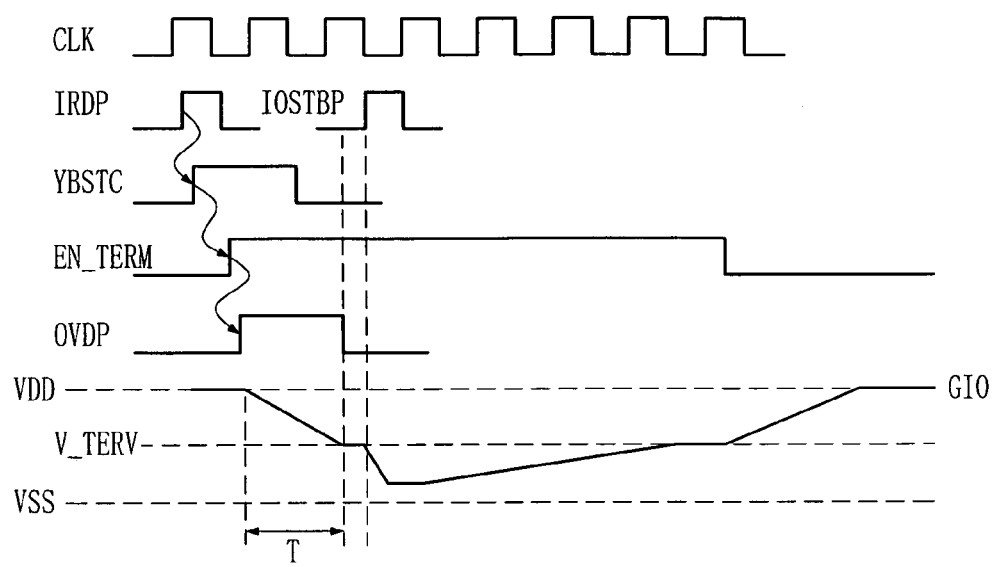
FIG. 10 is a signal timing diagram of a termination operation by the termination circuit illustrated in FIG. 9.

FIG. 10 is a signal timing diagram of the termination operation of the termination circuit 100B illustrated in FIG. 9. An internal read pulse IRDP is a signal generated when a read command is enabled. An input/output strobe pulse IOSTBP is a signal used to enable the read SA 20 illustrated in FIG. 1. A signal labeled as 'YBSTC' is a signal that becomes a logic high in response to the internal read pulse IRDP, and transits from the logic high to a logic low according to the length of a burst. The termination enabling signal EN_TERM is a signal that is set to a logic high when the 'YBSTC' signal becomes a logic high, and reset to a logic low after a certain delay time when the 'YBSTC' signal transits to the logic low. The second over-driving signal OVDP is generated by a logic combination of the termination enabling signal EN_TERM and the inverted and delayed signal of the termination enabling signal EN_TERM. The second over-driving signal OVDP is enabled for a predetermined period of time T. The first over-driving signal OVDPB (not illustrated) is a signal whose phase is opposite to the phase of the second over-driving signal OVDP. The first over-driving signal OVDPB is enabled for the period T.

For instance, when data of logic low are read in the state in which a logic high value is latched onto the GIO line GIO, the termination enabling signal EN_TERM is enabled with a logic high, and the first over-driving signal OVDPB and the second over-driving signal OVDP are enabled with a logic low and a logic high, respectively. As a result, the GIO line GIO is driven to a voltage level of the termination voltage V_TERM by the high load driving power for the predetermined period of time T. Afterward, once the input/output strobe pulse IOSTBP is enabled, the voltage level of the GIO line GIO becomes lower than the previous level. The data output mux 30 (see FIG. 1) can sense the sufficiently lowered voltage level of the GIO line GIO, and then the GIO line GIO sustains the voltage level of the termination voltage V_TERM. At this time, the first and second over-driving signals OVDPB and OVDP need to be disabled before the input/output strobe pulse IOSTPB is enabled. The reason for this precedent disabling is that if the enabling interval for the first and second over-driving signals OVDPB and OVDP overlaps with that for the input/output strobe pulse IOSTBP, the read SA 20 (see FIG. 1) operates in the 'T' interval in which a termination load driving power is great. Thus, the read SA 20 may not data may not be loaded appropriately onto the GIO line GIO In the semiconductor memory device according to the embodiment of the present invention, when the termination operation is performed, the main termination driving block 110A or 110B and the auxiliary termination driving block 120A or 120B operate together for the initial predetermined time T during the enabling interval for the termination enabling signal EN_TERM. As a result, the GIO line GIO is rapidly driven to a voltage level of the termination voltage V_TERM, which is about ½ of the voltage level of the external power supply voltage VDD. Thus, the read SA 20 can stably load data onto the GIO line GIO, and the data output mux 30 can accurately sense the data. Also, the fast and accurate loading of data onto the GIO line GIO allows the stable operation of the semiconductor memory device and effective usage of current for each interval. As a result, unnecessary current dissipation can be reduced.

Although the termination operation of the GIO line during the read operation is exemplified in the above embodiments, the embodied termination operation can also be applied for a write operation. Also, in addition to the GIO line, the embodiments can be implemented to data lines that transport data.

While the present invention has been described with respect to specific embodiment, it will be apparent to those skilled in the art that various changes and modifications may be made without departing from the spirit and scope of the invention as defined in the following claims.

What is claimed is:

1. A semiconductor memory device, comprising:
   a global input/output line configured to transport data between a core region and an interface region;
   a main driving block configure to drive a voltage level of the global input/output line to predetermined termination voltage level in response to a termination enabling signal; and
   an auxiliary driving block configured to drive the voltage level of the global input/output line to the predetermined termination voltage level in response to an over-driving signal, wherein the over-driving signal is enabled for a predetermined period of time during an initial period of an enabling interval for the termination enabling signal.

2. The semiconductor memory device of claim 1, further comprising a signal generator configured to generate the over-driving signal upon receipt of the termination enabling signal.

3. The semiconductor memory device of claim 1, wherein the over-driving signal includes first and second over-driving signals enabled for the predetermined period of time.

4. The semiconductor memory device of claim 2, wherein the signal generator includes:
   a delay unit delaying the termination enabling signal for the predetermined period of time; and an output unit outputting a first and a second over-driving signals upon receipt of the termination enabling signal and an output signal of the delay unit.

5. The semiconductor memory device of claim 4, wherein the delay unit includes an odd number of inverters.

6. The semiconductor memory device of claim 1, further comprising a latch unit configured to latch data loaded onto the global input/output line.

7. The semiconductor memory device of claim 6, wherein the latch unit includes a three-state latch responding to the termination enabling signal.

8. The semiconductor memory device of claim 3, wherein the auxiliary driving block includes:
   a first auxiliary driving unit generating a first current path between a terminal of a first power supply voltage and the global input/output line in response to the first over-driving signal; and
   a second auxiliary driving unit generating a second current path between the global input/output line and a terminal of a second power supply voltage in response to the second over-driving signal.

9. The semiconductor memory device of claim 8, wherein the main driving block includes:
   a first main driving unit generating a third current path between the terminal of the first power supply voltage and the global input/output line in response to an inverted signal of the termination enabling signal; and
   a second main driving unit generating a fourth current path between the global input/output line and the terminal of the second power supply voltage in response to the termination enabling signal.

10. The semiconductor memory device of claim 8, wherein the first power supply voltage is an external voltage, and the second power supply voltage is a ground voltage.

11. The semiconductor memory device of claim 9, wherein the first and second auxiliary driving units and the first and second main driving units drive the voltage level of the global input/output line for the predetermined period of time.

12. The semiconductor memory device of claim 9, wherein the first and second main driving units drive the voltage level of the global input/output line after the predetermined period of time during the enabling interval of the termination enabling signal.

13. The semiconductor memory device of claim 10, wherein the termination voltage level is approximately ½ of the voltage level of the external voltage.

14. A method for driving a semiconductor memory device comprising a global input/output line used to transport data between a core region and an interface region, the method comprising:
   driving a voltage level of the global input/output line to a predetermined termination voltage level for a predetermined period of time during an initial period of an enabling interval for a termination enabling signal; and
   driving the voltage level of the global input/output line with driving power lower than driving power used for the predetermined period of time during the enabling interval for the termination enabling signal.

15. The method of claim 14, wherein the predetermined termination voltage level is approximately ½ of an external voltage.

* * * * *